(12) United States Patent
Ouchi et al.

(10) Patent No.: US 7,692,609 B2
(45) Date of Patent: Apr. 6, 2010

(54) ACTIVE MATRIX TYPE DISPLAY

(75) Inventors: Takayuki Ouchi, Hitachi (JP); Shingo Ishihara, Hitachi (JP); Yoshiro Mikami, Hitachiohta (JP)

(73) Assignee: Hitachi, Ltd. (JP)

( * ) Notice: Subject to any disclaimer, the term of this patent is extended or adjusted under 35 U.S.C. 154(b) by 1343 days.

(21) Appl. No.: 11/111,893

(22) Filed: Apr. 22, 2005

(65) Prior Publication Data
US 2005/0190130 A1 Sep. 1, 2005

Related U.S. Application Data

(63) Continuation of application No. 10/244,458, filed on Sep. 17, 2002, now Pat. No. 6,888,520.

(30) Foreign Application Priority Data
Jan. 11, 2002 (JP) ................... 2002-4526

(51) Int. Cl.
G09G 3/30 (2006.01)
(52) U.S. Cl. ................... 345/76; 315/169.3; 345/82
(58) Field of Classification Search ............ 345/76–82, 345/204, 169.1, 169.3; 315/169.1, 169.3; 313/500
See application file for complete search history.

(56) References Cited

U.S. PATENT DOCUMENTS

| | | | |
|---|---|---|---|
| 5,118,987 A | 6/1992 | Leksell | |
| 5,598,004 A * | 1/1997 | Powell et al. | 250/370.09 |
| 5,701,055 A | 12/1997 | Nagayama | |
| 6,147,451 A * | 11/2000 | Shibata et al. | 313/506 |
| 6,339,288 B1 | 1/2002 | Qian | |
| 6,509,688 B1 * | 1/2003 | Bae et al. | 313/504 |
| 6,570,323 B1 | 5/2003 | Nakamata | |
| 6,641,933 B1 * | 11/2003 | Yamazaki et al. | 428/690 |
| 6,659,827 B2 | 12/2003 | Kim | |
| 6,690,116 B2 | 2/2004 | Song | |
| 6,888,520 B2 * | 5/2005 | Ouchi et al. | 345/82 |
| 6,924,854 B2 * | 8/2005 | Chung | 349/43 |
| 2002/0084454 A1 * | 7/2002 | Kim et al. | 257/40 |

* cited by examiner

Primary Examiner—Sumati Lefkowitz
Assistant Examiner—Seokyun Moon
(74) Attorney, Agent, or Firm—Antonelli, Terry, Stout & Kraus, LLP.

(57) ABSTRACT

An active matrix type display includes a light emission device having a transparent pixel electrode and a metal pixel electrode on both surfaces of a light emitting layer and a driving circuit controlling the driving current of the light emission device. The driving circuit is formed on a substrate, and the light emission device is formed as a layer above the driving circuit with an intermediate layer of insulation material interposed therebetween. The metal pixel electrode device is connected with the driving circuit through a conduction portion which extends through the intermediate layer. Thus, light emitted from the light emission device can be prevented from reaching transistors by locating the transistors below the metal pixel electrode, and leakage current produced by the light of a transistor in the off state can be suppressed to prevent degradation of the image quality.

5 Claims, 17 Drawing Sheets

ACTIVE MATRIX TYPE DISPLAY

CROSS REFERENCE TO RELATED APPLICATION

This application is a continuation of U.S. application Ser. No. 10/244,458, filed Sep. 17, 2002, now U.S. Pat. No. 6,888,520, the contents of which are incorporated herein by reference.

BACKGROUND OF THE INVENTION

The present invention relates to an active matrix type display device, for example, a display device using light emission devices that emit light by themselves, such as organic LEDs.

Demands for personal computers, portable information terminals, information communication equipment or composite products thereof have increased with the advent of a high information society. For use in such products, display devices of reduced thickness and weight and having a high-speed response are in demand.

As a display device which is suitable to meet such demands, displays that are formed by light emission devices that are capable of saving electric power have been proposed. Generally, an active matrix type display device is formed by arranging rectangular pixel regions in a matrix form on a substrate. For example, an organic LED, as one example of light emission devices is formed by putting an organic LED device, comprising a hole transportation layer, a charge injection layer and an organic light emission layer, between a transparent pixel electrode (anode) and a metal pixel electrode (cathode) in such a manner that both surfaces of the organic LED device are in contact with the transparent pixel electrode and the metal pixel electrode, respectively. Existent active matrix type organic LED display devices are formed by disposing a transparent pixel electrode of the organic LED device on the side of the transparent substrate, such as a substrate made of glass and disposing the metal pixel electrode on the side opposite to the substrate.

In the driving circuit for the organic LED device in each pixel, a first thin layer transistor (TFT1) is disposed at a position near the intersection between each of the scanning lines and the signal lines arranged in the form of a lattice, the TFT1 is driven by scanning signals and pixel signals to store data in a capacitor (holding capacitor), a second thin layer transistor (TFT2) is driven in accordance with the voltage of the capacitor and the current flowing to the organic light emitting layer by way of the transparent pixel electrode, which serves as the anode connected with the TFT2, is controlled to emit light. Then, light emitted from the organic light-emitting layer passes out through the transparent pixel electrode on the substrate side.

In the case of a bottom emission type display, in which emission light is taken out from the substrate, since the area of the driving circuit, comprising transistors TFT1, TFT2, the capacitor and lines arranged for each of the pixels, hinders light transmission, an improvement in the so-called aperture ratio is limited.

In view of the above, to improve the aperture ratio without effect on the driving circuits, such as the transistor TFT, a so-called top emission type display device, that takes out light from the side opposite to the substrate, has been proposed (Document: SID2001 Digest-24-4L). In such a top emission type of device, an improvement in the aperture ratio can be expected as compared with the bottom emission type of device. In this top emission type of device, light is taken out by using a transparent electrode layer on the upper side of the organic LED device, but the document referred to above discloses no actual structure of the organic LED device and the driving circuit.

Further, the dielectric constant of the transparent pixel electrode layer is generally greater by about one digit or more as compared with that of the metal pixel electrode layer. Accordingly, the current consumption increases as the size of the display panel becomes larger, which poses a problem in that the power loss of the current supply line to the organic LED device increases.

Further, the organic LED device has the characteristic that it degrades rapidly due to heat or humidity. Accordingly, the method of forming a transparent pixel electrode layer in the upper portion, or a method of patterning the transparent pixel electrode layer, becomes significant. In particular, to realize multi-color display, organic LED devices capable of displaying plural colors are necessary. However, since the light emission characteristics of devices are different from one color to another color at present, it is preferred to separate, for each color, the lines for current supply in order to effectively control the display colors. However, this involves a problem in that it is difficult to form the transparent pixel electrode layer into an optional shape.

A first object of the present invention is to provide a specific pixel structure in a top emission type display device using light emission devices.

A second object of the present invention is to provide a current supply structure to a transparent pixel electrode that is capable of coping with an increase in the scale in the top emission type display device using light emission devices.

A third object of the present invention is to provide a pixel structure that is suitable to coloration of a panel in the top emission type display device using organic LED devices.

SUMMARY OF THE INVENTION

According to a first aspect of the present invention, there is provided an active matrix type display device comprising a substrate and a plurality of pixels arranged in the form of a matrix on the substrate, wherein each of the pixels includes a light emission device that is prepared by forming a transparent pixel electrode and a metal pixel electrode on respective surfaces of a light emitting layer, and a driving circuit for controlling a driving current of the light emission device. The driving circuit is formed on the substrate, and the light emission device is formed in a layered manner above the driving circuit with an intermediate layer made of an insulation material interposed therebetween, the transparent pixel electrode being situated on the side opposite to the substrate; and, the metal pixel electrode of the light emission device is connected with the driving circuit through a conduction portion which extends through the intermediate layer.

With this configuration, since the aperture ratio of the light emission device is free from the effect of the driving circuit in the lower layer, for example, a scanning signal line, pixel signal lines, a current line allowing a driving current of the light emission devices to flow therethrough and a transistor, the aperture ratio can be increased. In particular, since the aperture ratio is determined only by the conduction portion for connecting the lower layer portion and the upper layer portion, an extremely high aperture ratio can be obtained.

In the case described above, the transistors for controlling a driving current of the light emission devices are preferably disposed below the metal pixel electrode of the light emission device. With this configuration, the light emitted from the light emission device can be shielded by the metal pixel electrode, and the occurrence of leakage current due to the light produced in the off state of the transistor can be suppressed. As a result, the change in the potential of the capacitor to which image data is written by the transistors can be suppressed so as to reduce the degradation in the image quality.

In particular, the metal pixel electrode covering the transistors is preferably a metal pixel electrode of the light emission device of the preceding stage in the scanning direction. That is, when a pixel signal is written to a corresponding capacitor by the transistor, since the metal pixel electrode in the upper layer has already been selected, it is in a constant potential state. Accordingly, the effect on the writing operation can be decreased. In addition, since current flows through the metal pixel electrode in this case, the effect caused by peripheral electric fluctuations can also be shielded.

According to a second aspect of the present invention, there is provided an active matrix type of display device comprising a substrate; and a plurality of pixel elements arranged in the form of a matrix on the substrate, wherein each of the pixels includes a lower layer having a driving circuit formed thereon, an intermediate layer made of an insulator material formed on the lower layer, and an upper layer having a light emission device that is formed on the intermediate layer. The driving circuit includes scanning signal lines and image signal lines disposed so as to cross each other along the arrangement of the pixels, a first current line for allowing a driving current of the light emission device to flow therethrough, and a transistor circuit connected with the scanning signal line and the image signal line to control the driving current of the light emission device by way of the first current line in response to a scanning signal and a pixel signal. The light emission device includes a light emitting layer, and a transparent pixel electrode and a metal pixel electrode with the light emitting layer interposed therebetween, the transparent pixel electrode being situated on the side opposite to the substrate. The transistor circuit is connected with the metal pixel electrode of the light emission device through a conductor which extends through the intermediate layer and is disposed below a metal pixel electrode of a pixel of the preceding stage in the scanning direction of the pixels, and a second current line is disposed in the upper layer so as to allow a driving current of the light emission device to flow therethrough. The second current line is connected with the transparent pixel electrode of the light emission device.

While a transparent pixel electrode of high light permeability generally has a high sheet resistance, formation of the second current line can reduce the loss due to the lines and can provide the light emission devices with more pixel current. In particular, as the size of the display panel enlarges, the amount of current per line increases, and the length of the lines also will increase resulting in more current loss in the current lines. Thus, it is difficult to apply a sufficient voltage to light emission devices remote from a power source because of the voltage drop along the lines; however, provision of the second current line with low resistance makes it possible to obtain a large sized panel.

In this case, the second current line formed in the upper layer can be extended to a portion overlapping the first current line. Further, when the capacitor for controlling the transistor that defines the driving current of the light emission device is disposed below the first and second current lines at a constant potential, the voltage held in the capacitor can be held more stably to attain a display of high quality. Further, the pixel signal line and the first current line preferably extend in one identical direction and are disposed substantially at an equal interval. This can minimize the wiring capacitance between the pixel signal line and the first current line so as to reduce the load capacitance of the transistor that writes pixel data into the capacitor and enable high-speed operation.

Further, the second current lines are preferably disposed in a lattice-like configuration along the arrangement of the pixels. This can decrease the voltage drop caused by the second current lines, which is applicable to large sized panels.

According to a third aspect of the present invention, there is provided an active matrix type of display device comprising a substrate, and a plurality of pixels arranged in the form of a matrix on the substrate, wherein each of the pixels includes a light emission device prepared by forming a transparent pixel electrode and a metal pixel electrode on both surfaces of a light emitting layer and a driving circuit for controlling a driving current of the light emission device. The driving circuit is formed on the substrate, the light emission device is formed in a layered manner above the driving circuit, with an intermediate layer made of an insulation material interposed therebetween, the transparent pixel electrode being situated on the side opposite to the substrate. The metal pixel electrode of the light emission device is connected with the driving circuit through a conduction portion which extends through the intermediate layer, and an insulative partition wall having a height higher than the height of the transparent pixel electrode is formed at the boundary region between the plurality of respective pixels.

With this configuration, the light emission device can be prepared by forming a mask (for example an interlayer insulative layer) for an aperture that defines the light emission device, and vapor depositing light emitting materials of different emission colors, or dissolving such light emission materials into a solvent and printing them by means of an ink jet printer or the like, in the apertures defined on a color basis, thereby making it possible to cope with coloration. That is, by arranging light emission devices that emit different colors, for example, red, green and blue, for each row of pixels successively, and connecting the second current lines separately on a color basis to a power source, the bias voltage for light emission devices having different characteristics of respective colors can be adjusted and, as a result, color images of high quality can be obtained.

According to a fourth aspect of the present invention, there is provided an active matrix type of display device comprising: a substrate, and a plurality of pixels arranged in the form of a matrix on the substrate, wherein each of the pixels includes a lower layer having a driving circuit formed thereon, an intermediate layer made of an insulator material formed on the lower layer, and an upper layer having a light emission device formed on the intermediate layer. The driving circuit includes a transistor circuit that controls a driving current of the light emission device in response to a scanning signal and a pixel signal. The light emission device includes a light emission layer, and a transparent pixel electrode and a metal pixel electrode with the light emission layer interposed therebetween, the transparent pixel electrode being situated on the side opposite to the substrate. The transistor circuit is connected with the metal pixel electrode of the light emission device through a conductor which extends through the intermediate layer, and it is disposed below the metal pixel electrode of a pixel of the preceding stage in a scanning direction of the pixels.

The light emitted obliquely from the light emission device is reflected at a transparent protective layer formed on the surface and intrudes into other pixels to possibly lower the contrast. In this regard, when the second current line of the constitution described above is provided, since the light that is emitted obliquely from the light emission device is reflected on the surface of the second current line and is emitted to the outside as an emission light of that pixel, the light output efficiency can be improved as a whole.

BRIEF DESCRIPTION OF THE DRAWINGS

Other objects and advantages of the invention will become apparent from the following description of various embodiments when taken with reference to the accompanying drawings, in which.

DETAILED DESCRIPTION OF PREFERRED EMBODIMENTS

Preferred embodiments of this invention will be described with reference to the drawings.

Embodiment 1

FIGS. 1 to 4 show views of the construction of an active matrix type display device according to a first embodiment of the invention.

Figure 4:
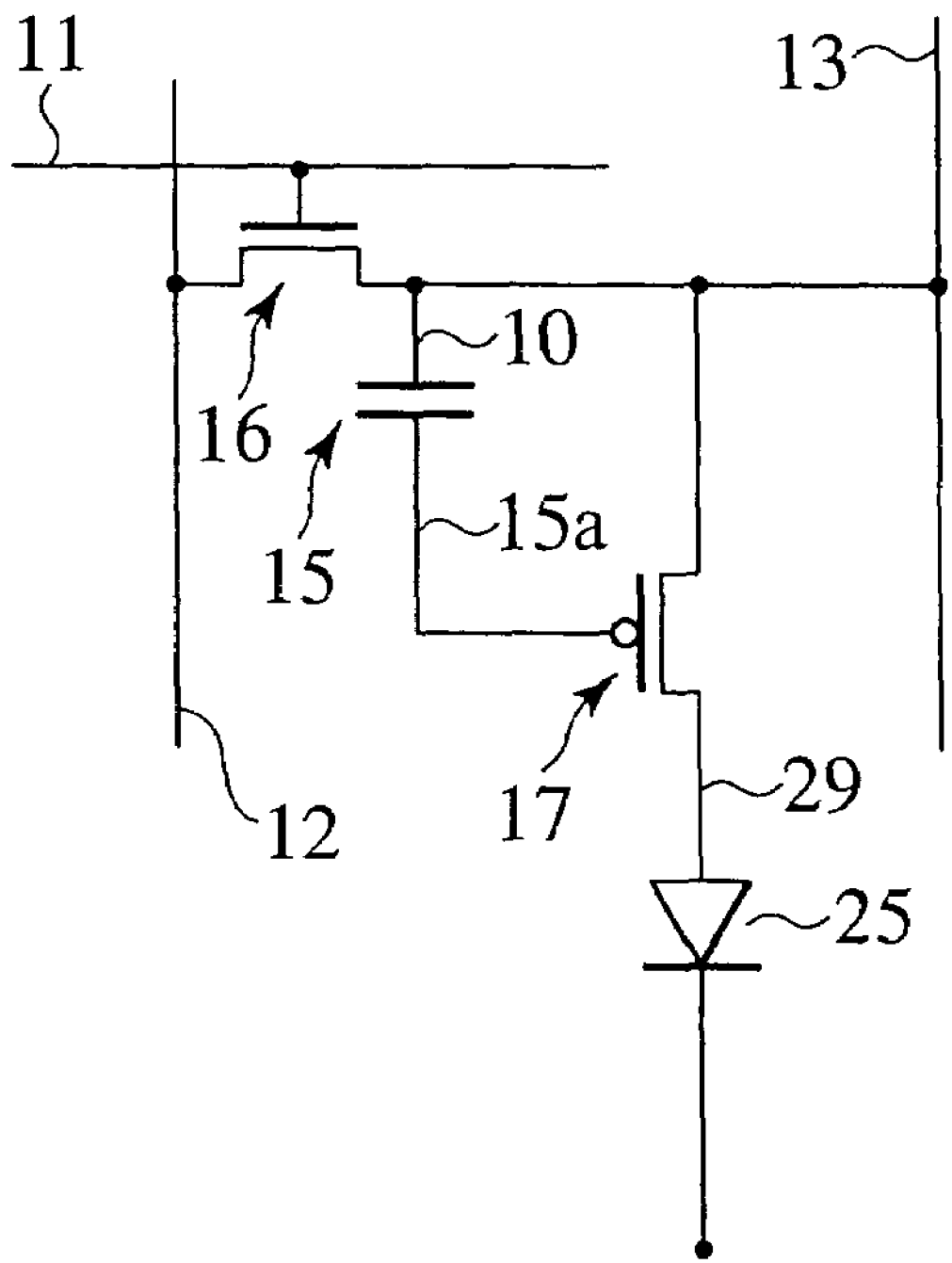
FIG. 4 is an equivalent circuit diagram of a representative pixel in a preferred embodiment according to this invention.

FIG. 4 is a circuit diagram of a driving circuit for a pixel. As shown in FIG. 4, a first thin film transistor Tsw 16 is disposed at each intersection between a scanning signal line 11 and a pixel signal line 12, which signal lines are wired in the form of a matrix. In this circuit, a gate electrode of the transistor Tsw 16 is connected to the scanning signal line 11, a source electrode thereof is connected to the pixel signal line 12 and a drain electrode thereof is connected to a first current line 13. Further, the first current line 13 is connected by way of a source-drain circuit of a second thin film transistor Tdr 17 to an anode (metal pixel electrode 18) of an organic LED device 25, which serves as a light emission device. The cathode (transparent pixel electrode 19) of the organic LED device 25 is grounded to the earth. Further, a gate electrode of the transistor Tdr 17 is connected by way of a line 10 to a capacitor (holding capacitance) Cs 15, and the other end of the capacitor 15 is connected with the drain of the transistor Tsw 16. Therefore, when the scanning signal on line 11 is H, the transistor Tsw 16 turns on so as to hold a pixel signal from line 12 in the capacitor Cs 15, whereby the transistor Tdr 17 is driven as an active device in accordance with the voltage of the capacitor Cs 15 so as to control the current flowing from the line 13 to the organic LED device 25. Thus, the organic LED device 25 emits light in response to the pixel signal.

Figure 1:
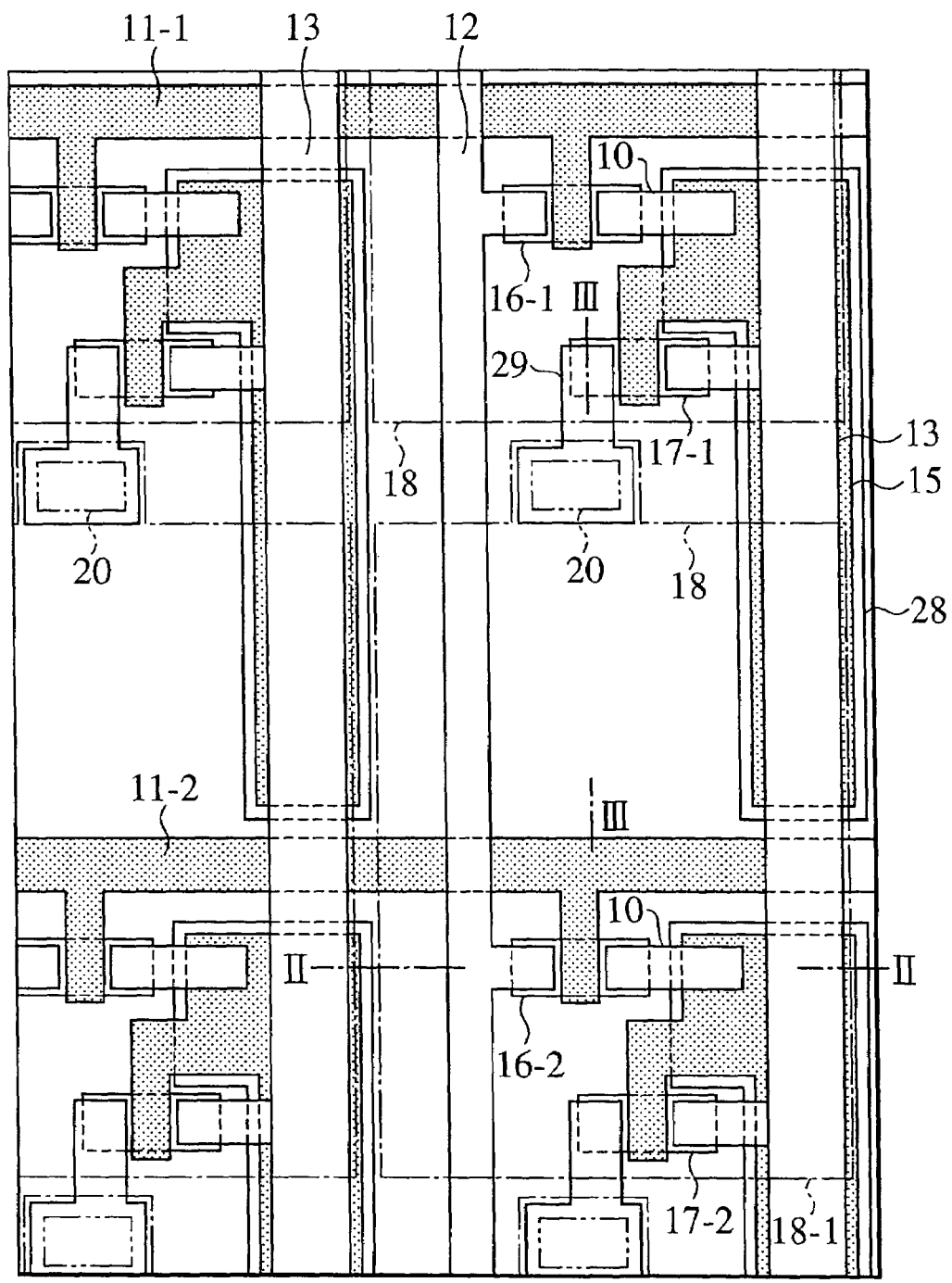
FIG. 1 is a plan view showing a portion of a pixel region in a display device according to a first embodiment of the invention.
Figure 2:
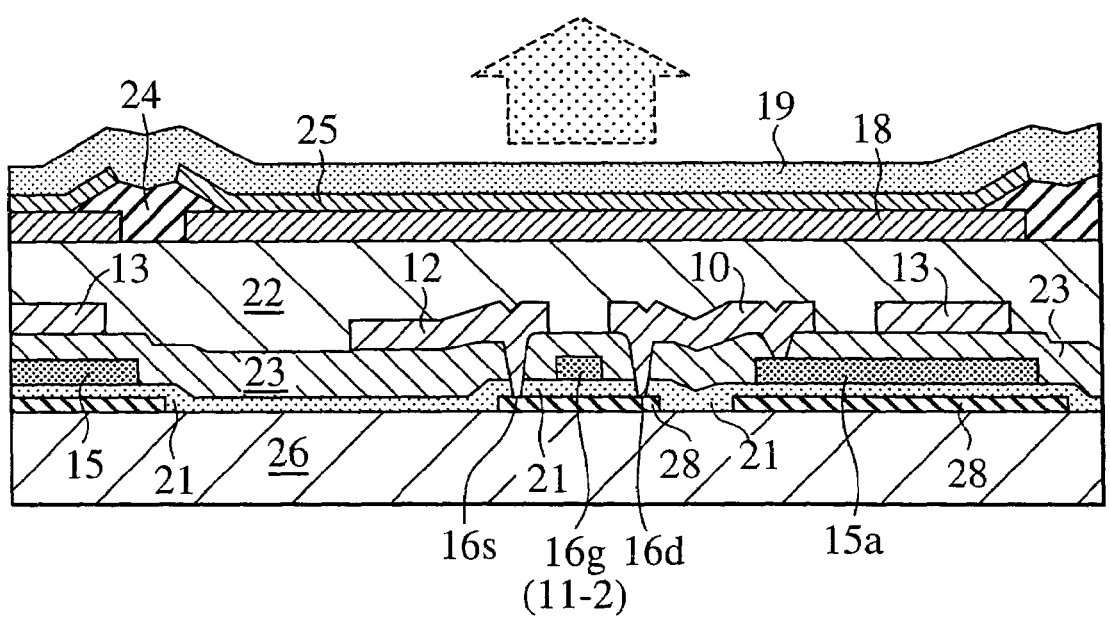
FIG. 2 is a cross-sectional view of the display device taken along line II-II in FIG. 1.
Figure 3:
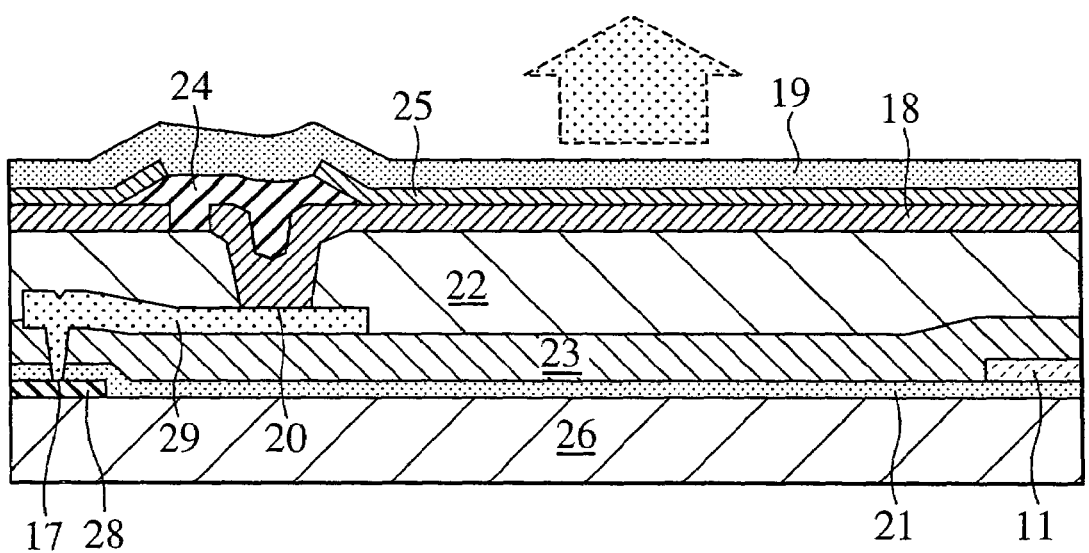
FIG. 3 is a cross sectional view of the display device taken along line III-III in FIG. 1.

The display device formed of the driving circuits and the organic LED devices as described above is structurally constituted as shown in FIGS. 1 to 3. The display is divided, as shown in the cross sectional view of FIG. 2, into a lower layer having a driving circuit formed on a substrate 26, an insulative layer 22 serving as an intermediate layer formed on the lower layer, and an upper layer having the organic LED device 25 formed on the insulative layer 22. FIG. 1 shows a plan view as seen on the side of the lower layer in which a driving circuit for a portion of the pixel region is formed; and, to show the relative positional relationship with respect to the upper layer, the metal pixel electrode 18 is shown by a dotted chain line.

As shown in FIG. 1 to FIG. 3, scanning signal lines 11 (11-1, 11-2) and pixel signal lines 12 are disposed as a lattice, and each pixel corresponds to a region surrounded by the signal lines. As will be described later, rectangular metal pixel electrodes 18, constituting the pixels, are arranged such that each of the electrodes is displaced downward (in the direction of a row), as seen in the drawing, by about one-half pitch of a rectangular region surrounded by the scanning signal lines 11 and the pixel signal lines 12. Further, the first current lines 13 are disposed such that each of them extends in the direction of a row in parallel with the pixel signal lines 12. Each first thin film transistor Tsw 16 is disposed at a position near an intersection between a scanning signal line 11 and a pixel signal line 12. The gate electrode and the source electrode of the transistor Tsw 16 are connected to the scanning signal line 11 and the pixel signal line 12, respectively, while the drain electrode thereof is connected by way of the line 10 to the capacitor 15 for accumulating pixel data. Each second thin film transistor Tdr 17 for controlling the current flowing to the organic LED device 18 is disposed at a position near the transistor Tsw 16, and the source electrode thereof is connected to the first current line 13, while the drain electrode thereof is connected through a contact area 20 opened in the insulative layer 22 to the metal pixel electrode 18 of the LED device 25 by way of a line 28. The upper surface of the insulative layer 22 is flattened on the side where the metal pixel electrode 18 is formed.

As described previously, the metal pixel electrodes 18 are positioned so as to each be displaced in the direction of a row, so as to cover the circuit including transistor Tsw 16 and transistor Tdr 17 of a pixel selected subsequent to its own pixel in the sequence of scanning. In other words, the circuit including the transistors Tsw 16 and Tdr 17 is covered by the metal pixel electrode 18 that is selected before its own pixel in the sequence of scanning. For example, in FIG. 1, in the sequence of scanning, the scanning signal line 11-2 being scanned subsequent to the scanning signal line 11-1, transistors Tsw 16-2 and Tdr 17-2 of the driving circuit for the pixel connected to the scanning signal line 11-2 are covered at the upper portion thereof with a metal pixel electrode 18-1 that is connected with transistor Tdr 17-1 for the pixel driven by the scanning signal line 11-1 in the preceding stage.

The cross-sectional structure of the pixel region as thus constituted will be described with reference to FIGS. 2 and 3. FIG. 2 is a cross-sectional view taken along line II-II in FIG. 1 and FIG. 3 is a cross-sectional view taken along line III-III in FIG. 1.

As shown in these figures, for the thin film transistors Tsw 16 and Tdr 17, a gate electrode 16g is patterned on a gate insulative layer 21 formed by stacking $SiO_2$ on a polycrystalline silicon thin film layer 28, that is formed on the upper surface of the substrate 26, and an interlayer insulative layer 23 is further patterned, on which the pixel signal line 12 and the line 10 are connected, while being in contact with the source electrode and the drain electrode. The gate electrode 16g can be formed, for example, of a metal, such as chromium (Cr) or aluminum (Al), or an alloy material thereof. The interlayer insulative layer 23 can be formed of a single layer of $SiO_2$ or SiN, or a laminate thereof. Contact with the source electrode and the drain electrode can be established by a metal, such as Al or an alloy thereof. Further, the capacitor Cs 15 is constituted by using, as a dielectric member, the gate insulative layer 21 interposed between the polycrystalline silicon thin film 28 and an electrode 15a, that is formed of the same material as the gate electrode 16g.

As shown in FIGS. 2 and 3, in the pixel driving circuit, a portion containing the transistors Tsw 16, Tdr 17, capacitor 15 and first current line 13 is formed in the lower layer portion below the insulative layer 22 serving as the intermediate layer portion. Then, in the upper layer portion, above the insulative layer 22, the metal pixel electrode 18 is patterned on the insulative layer 22. In this step, by forming an opening in the insulative layer 22 at a position corresponding to the line 28, that is connected to the drain electrode of the transistor Tdr 17, in the layer portion connected with the metal pixel electrode 18, a contact area 20 for connecting the metal pixel electrode 18 with the line 28 is formed at the position of the opening. Then, after covering the portion above the contact area 20 with an interlayer insulative layer 24 and forming an opening area in the upper surface of the metal pixel electrode 18, the organic LED device 25 is formed using a mask by a method, such as patterning vapor deposition; and, further, a transparent pixel electrode 19 is stacked on the organic LED device 25. Then, they are sealed with a transparent substrate or layer, made of a material, such as glass or plastic, with no gaps, or they are sealed in a state of being filled with an inert gas. The transparent pixel electrode 19 is formed in common over the entire display, and it is connected with a grounding line at a periphery, not shown, of the display device.

According to the first embodiment, having the constitution as described above, since the aperture ratio of the organic LED device 25 is determined only by the contact area 20 for connecting the lower layer portion and the upper layer portion, which is free from the effects, for example, of the thin film transistors 16, 17, the scanning signal line 11, the pixel signal line 12 and the first current line 13 in the lower layer portion, an extremely high aperture ratio can be obtained.

Further, since the thin film transistors Tsw 16 and Tdr 17 are covered with the metal pixel electrode 18, they are free from the effect of light emitted from the organic LED device 25, which contains a light-emitting layer. As a result, since the occurrence of a leakage current, which is caused by the light produced in the off state of the transistors, can be suppressed, the change in the potential of the capacitor 15 can be suppressed, so as to reduce the degradation in image quality.

In particular, by covering the thin film transistors Tsw 16 and Tdr 17 by the metal pixel electrode 18 of the pixel at the preceding stage in the scanning direction, since the metal pixel electrode 18 in the upper layer has already been selected and is at a constant potential state when a pixel signal is written to the thin film transistor Tsw 16 by the pixel signal of the pixel signal line 12, the effect thereof on the writing operation can be reduced. In addition, since current flows in the metal pixel electrode 18 in this case, it has also an effect of shielding the effect of periphery electrical fluctuations.

Embodiment 2

Figure 5:
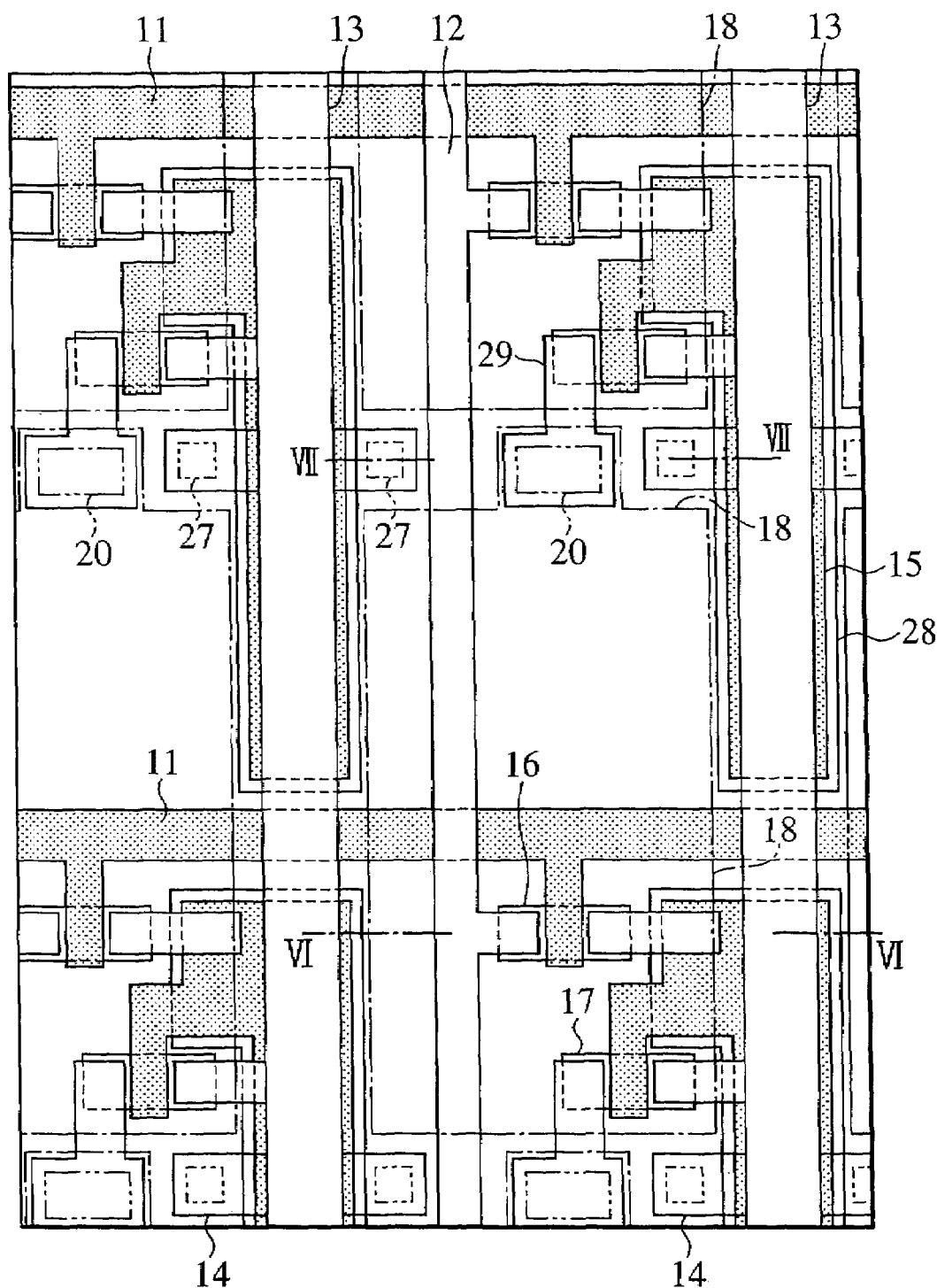
FIG. 5 is a plan view showing a portion of a pixel region in a display device according to a second embodiment of this invention.
Figure 6:
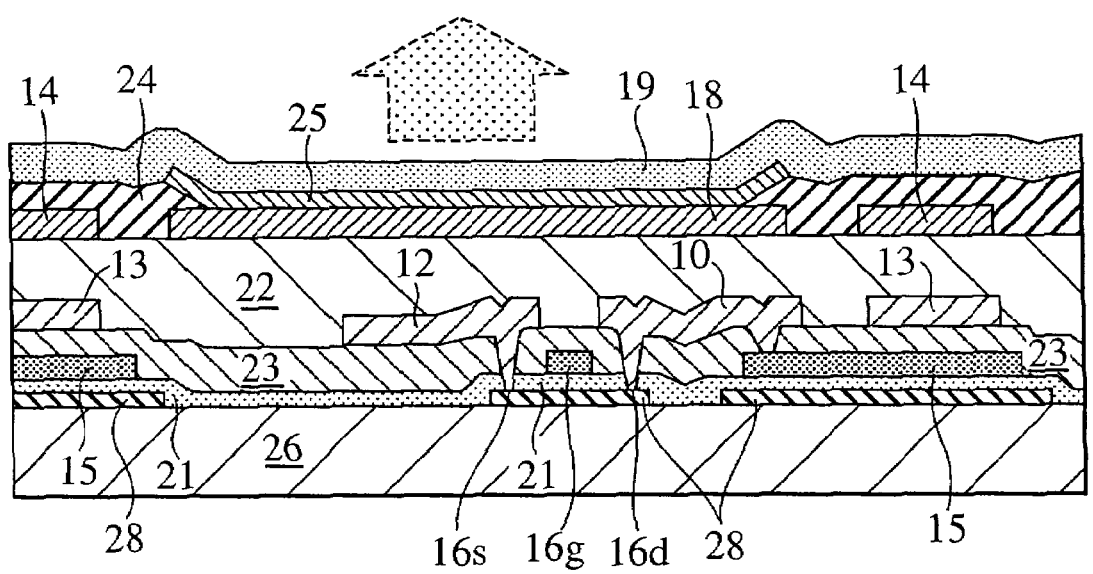
FIG. 6 is a cross-sectional view of the display device taken along line VI-VI in FIG. 5.
Figure 7:
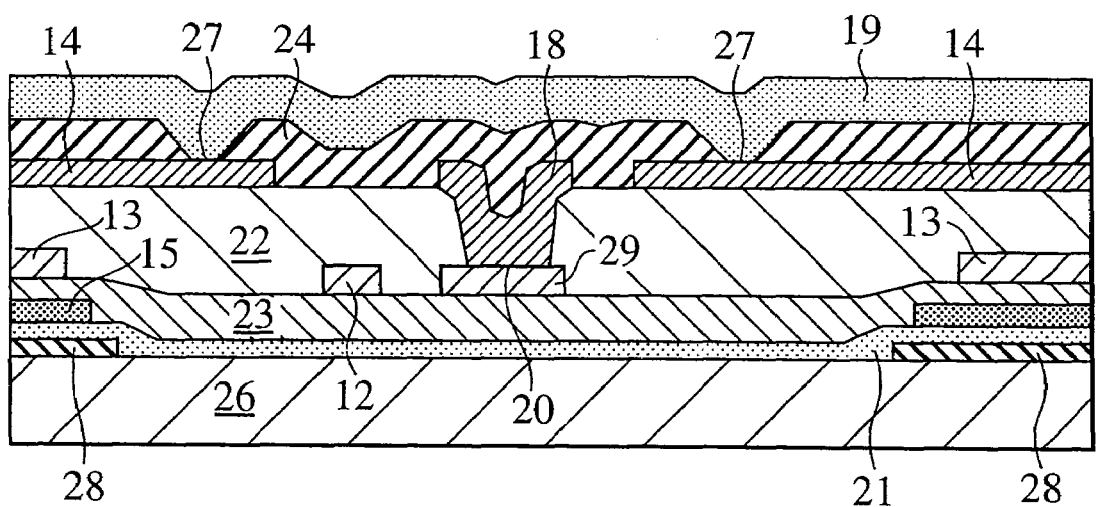
FIG. 7 is a cross-sectional view of the display device taken along line VII-VII in FIG. 5.

FIGS. 5 to 7 are views of the construction of an active matrix type display device representing a second embodiment of the invention. FIG. 5 is a plan view showing a portion of a pixel region in the same manner as in FIG. 1; FIG. 6 is a cross-sectional view taken along line VI-VI in FIG. 5; and FIG. 7 is a cross-sectional view taken along line VII-VII in FIG. 5.

This embodiment is different from the first embodiment in that, when the metal electrode 18 is patterned on the insulative layer 22 with aluminum Al or an alloy material thereof, second current lines 14 are formed simultaneously. The second current lines 14 are formed each at a position substantially equal with that of the first current line 13 in the lower layer portion in each of the pixels. The second current line 14 is connected through a contact area 27 with the transparent pixel electrode 19.

In this case, a material of high light permeability, such as ITO, is preferably used for the transparent pixel electrode 19. Generally, since the sheet resistance of ITO is higher by one digit or more than that of Al, when the transparent pixel electrode 19 itself is used for the current line, as in the first embodiment, the current supplied to the organic LED device 25 is sometimes restricted due to a voltage drop in the transparent pixel electrode 19. In this regard, according to this embodiment, since the second current line 14 is formed, a larger pixel current can be supplied to each of the organic LED devices 25 by reducing the loss due to the transparent pixel electrode 19.

In other words, as a display panel becomes larger in size, the amount of current flowing to the transparent pixel electrode 19 increases, while the distance along which the current flows also increases; therefore, the resistance is increased, thereby to increase the current loss. Because of the voltage drop, it is difficult to apply a sufficient voltage to organic LED devices 25 that are remote from the power source. Accordingly, provision of the second current lines of low resistance makes it possible to realize a large sized display panel.

Further, since the capacitor 15 for controlling the thin film transistor 17, that defines the driving current for the organic LED device 25, is disposed below the current lines 13, 14 at a constant potential, the voltage held in the capacitor 15 can be held more stably, thereby to provide a high quality display.

Embodiment 3

Figure 8:
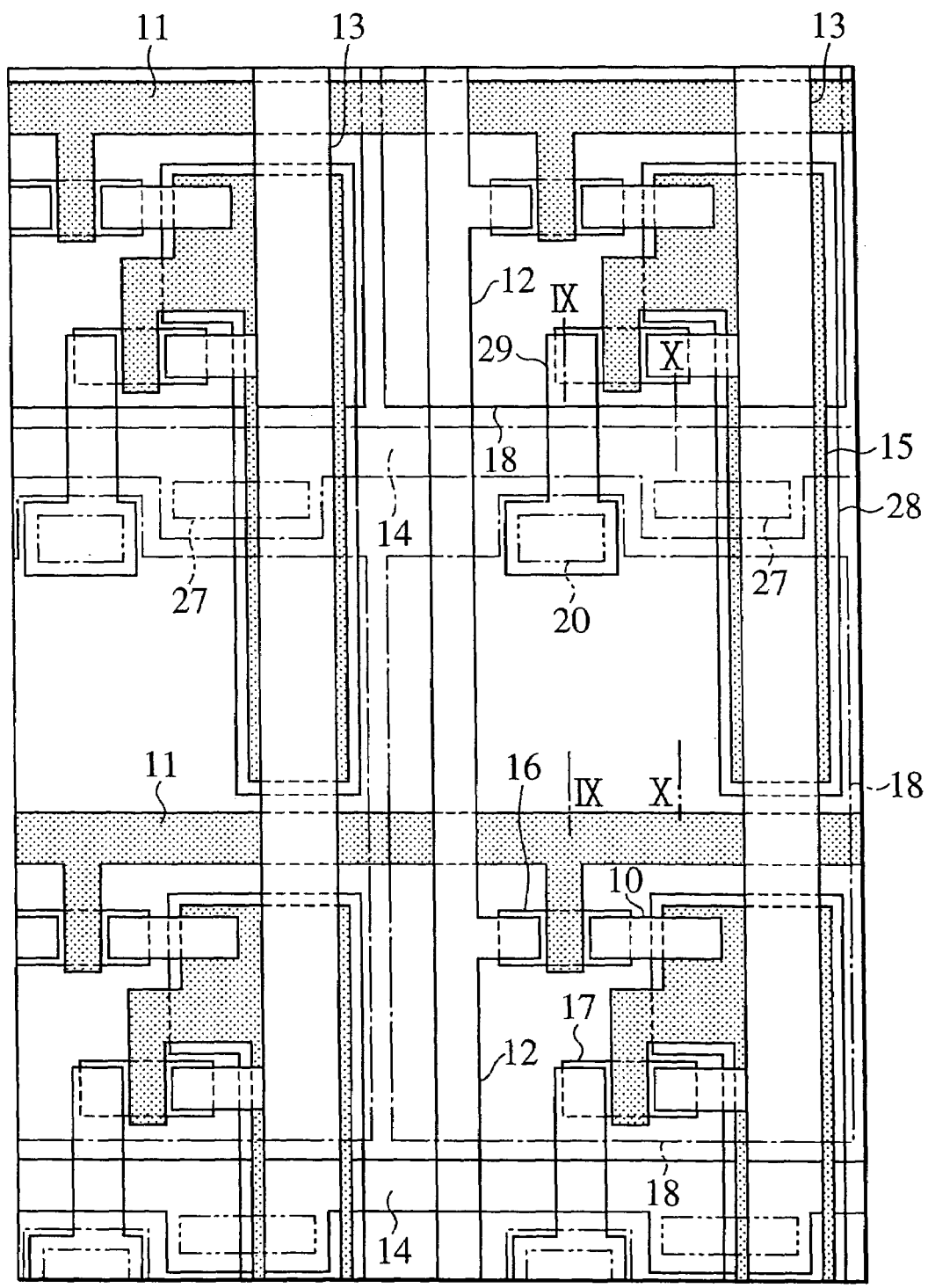
FIG. 8 is a plan view showing a portion of a pixel region in a display device of a third embodiment according to this invention.
Figure 9:
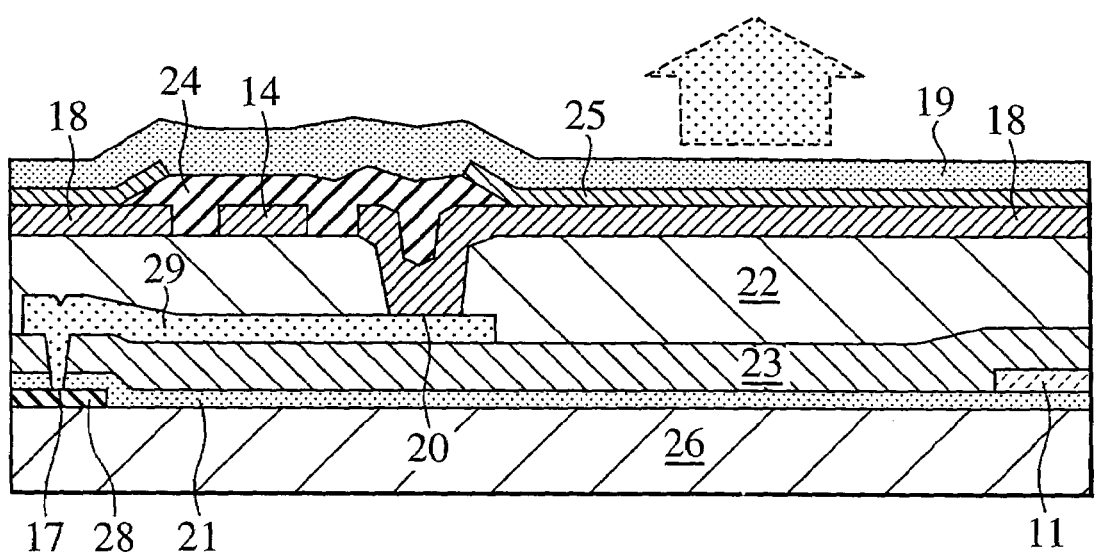
FIG. 9 is a cross-sectional view of the display device taken along line IX-IX in FIG. 8.
Figure 10:
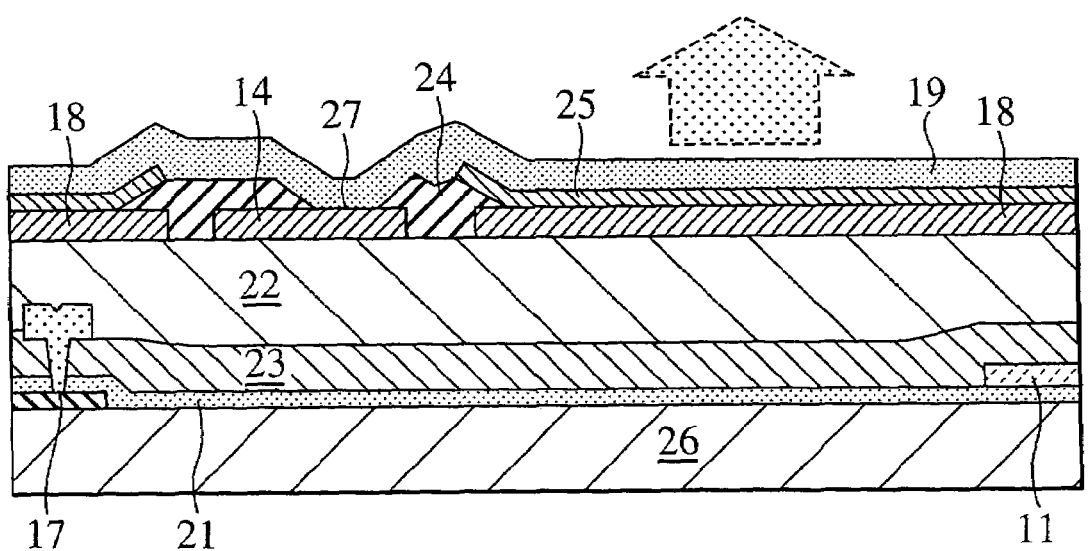
FIG. 10 is a cross-sectional view of the display device taken along line X-X in FIG. 8.

FIGS. 8 to 10 show views of the construction of an active matrix type display device representing a third embodiment of the invention. FIG. 8 is a plan view showing a portion of a pixel region in the same manner as in FIG. 1; FIG. 9 is a cross-sectional view taken along line IX-IX in FIG. 9; and FIG. 10 is a cross-sectional view taken along line X-X in FIG. 8.

This embodiment is different from the second embodiment in that second current lines 14 formed on the insulative layer 22 are each disposed in parallel with a shorter side of the metal pixel electrode 18. The metal pixel electrode 18 is connected by way of a contact area 20 with the second thin film transistor Tdr 17 controlling the driving current, and the second current line 14 is connected with a transparent pixel electrode 19 by way of a contact area 27.

Since the second current lines 14 are disposed in parallel with the shorter side of the metal pixel electrode 18, the aperture area that contributes to the light emission of the organic LED device 25 can be made closer to a square in shape, and the aperture ratio can be increased as compared with the second embodiment shown in FIG. 5. Accordingly, when a comparison is made on the basis of identical pixel brightness, since the current density in each of the organic LED devices 25 can be reduced, the device life can be improved.

Embodiment 4

Figure 11:
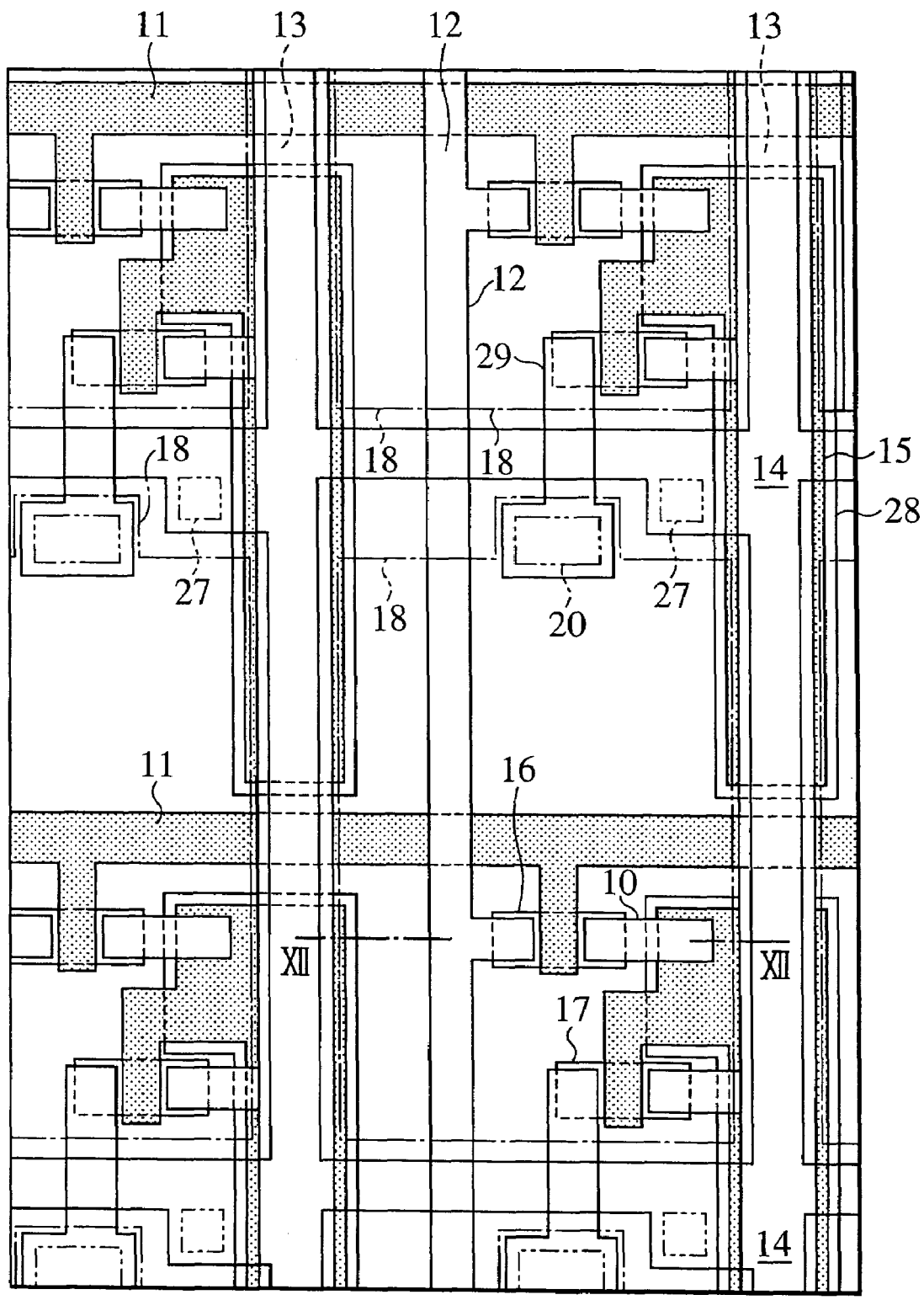
FIG. 11 is a plan view showing a portion of a pixel region in a display device according to a fourth embodiment of the invention.
Figure 12:
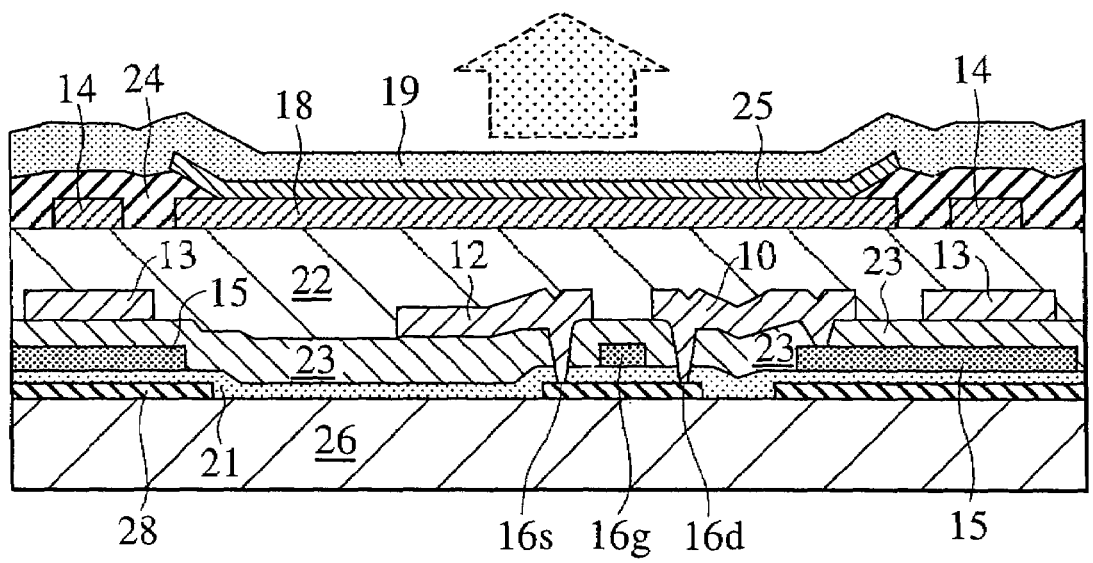
FIG. 12 is a cross-sectional view of the display device taken along line XII-XII in FIG. 11.

FIGS. 11 and 12 are views of the construction of an active matrix type display device representing a fourth embodiment of the invention. FIG. 11 is a plan view showing a portion of a pixel region in the same manner as in FIG. 1; and FIG. 12 is a cross-sectional view taken along line XI-XI in FIG. 11.

This embodiment is different from the second or third embodiment in that the second current lines 14 are arranged as a mesh to surround the metal pixel electrode 18. The metal pixel electrode 18 is connected by way of the contact area 20 with the second thin film transistor Tdr 17 that controls the driving current, and the second current line 14 is connected by way of a contact area 27 with the transparent pixel electrode 19.

In the second or third embodiment, the second current lines are formed independently in every row direction or column direction of pixels. Accordingly, since the voltage drop increases in the second current line in the line in which the amount of current supply increases even when the width of the line is increased, as compared with the line in which the amount of current supply is small, this tends to appear as a difference in the display. For example, consider the case of attaining a maximum brightness of 500 cd/m$^2$ at an efficiency of 7 cd/A of the organic LED device 25 in a display panel having a diagonal size of 20 inch or more. In this case, when the current lines 13, 14 are formed by using Al having a sheet resistance of 0.1 Ω/□ in a pixel having a size of 108×320 μm, the width of the line has to be made about 60 μm to suppress the voltage drop to 3 V or less. Aside from the first current line 13, since the second current line 14 gives a direct effect on the aperture ratio, it is preferred that the line width is narrowed. In view of the above, in this embodiment, the aperture ratio is improved by disposing the second current line 14 as a mesh, thereby decreasing the width of the lines.

Embodiment 5

Figure 13:
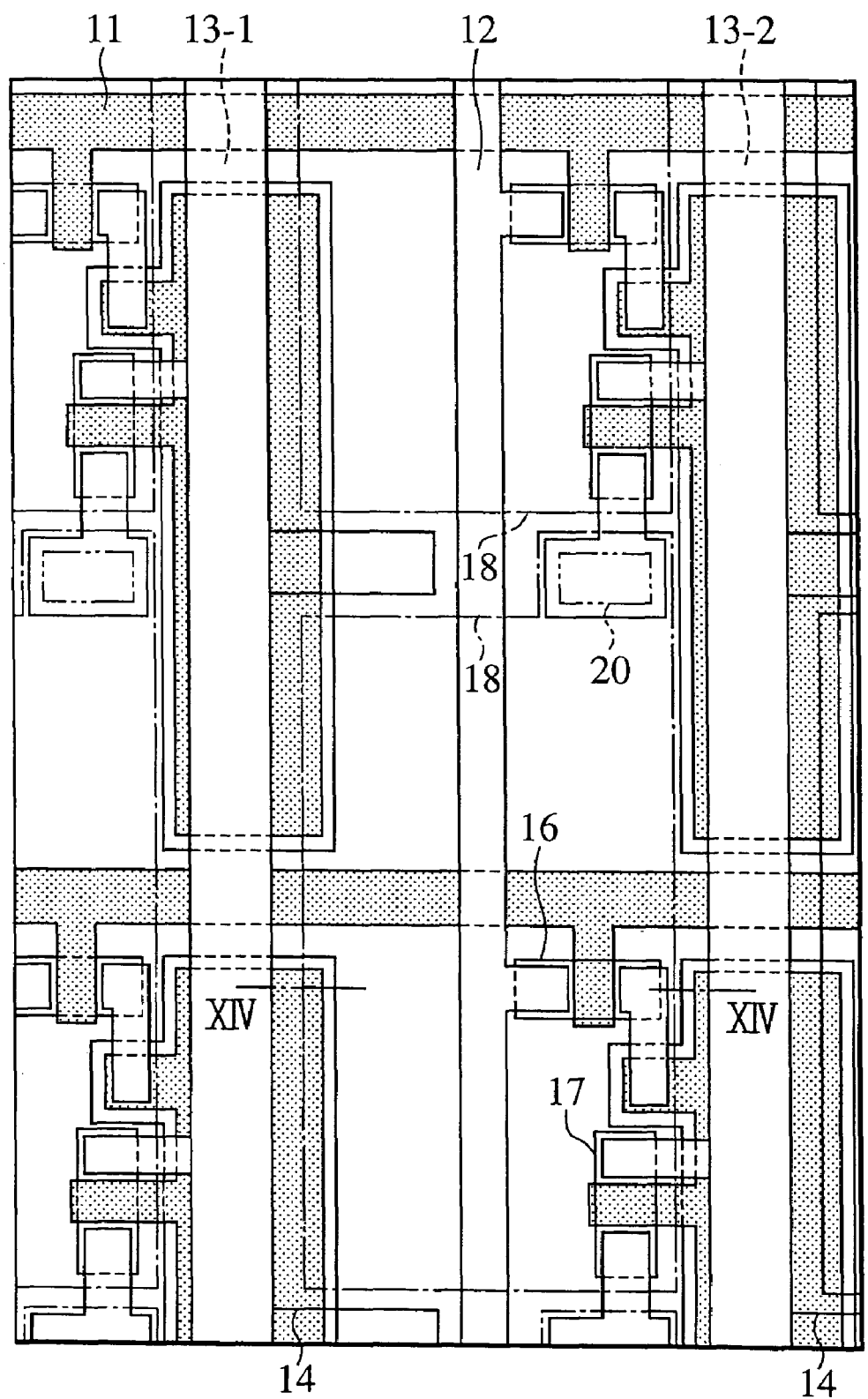
FIG. 13 is a plan view showing a portion of a pixel region in a display device according to a fifth embodiment of the invention.
Figure 14:
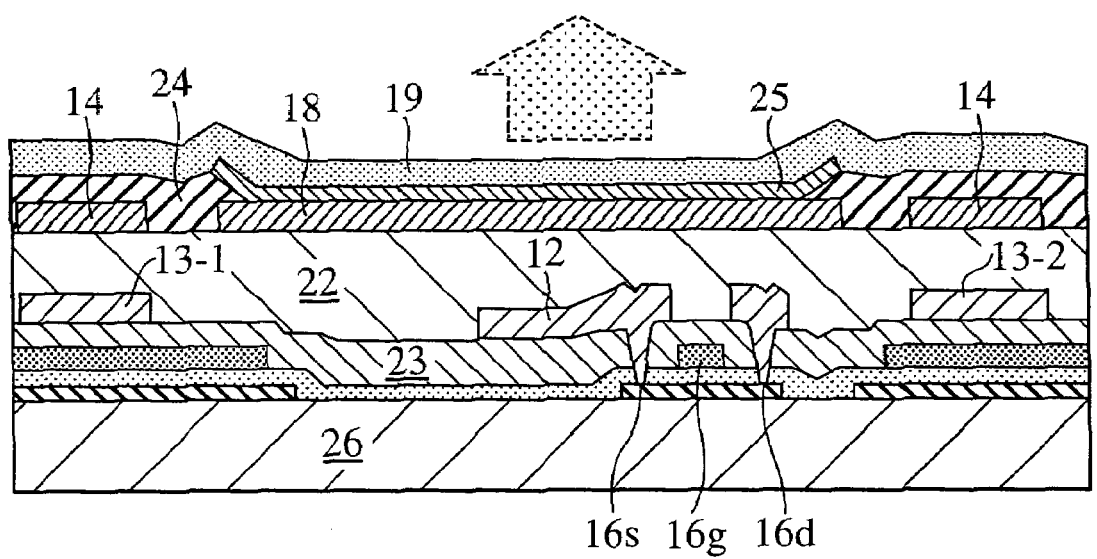
FIG. 14 is a cross-sectional view of the display device taken along line XIV-XIV in FIG. 12.

FIGS. 13 and 14 show views of the construction of an active matrix type display device representing a fifth embodiment of the invention. FIG. 13 is a plan view showing a portion of a pixel region in the same manner as in FIG. 1; and FIG. 14 is a cross-sectional view taken along line XIV-XIV in FIG. 13.

This embodiment is different from the second embodiment in that the pixel signal line 12 formed in the lower layer portion is positioned substantially at the center between the adjacent first current lines 13-1 and 13-2. The voltage of the pixel signal that is transmitted by the pixel signal line 12 is stored in the capacitor Cs 15 by the thin film transistor Tsw 16 selected by the scanning signal line 11. Then, when the thin film transistor Tsw 16 turns off, the current controlled by the thin film transistor Tdr 17, in accordance with the voltage stored in the capacitor Cs 15, is supplied through the contact 20 to the organic LED device 25.

As described above, by disposing the pixel signal line 12 at a position most remote from the adjacent first current line 13, the interline capacitance of the lines can be minimized. The interline capacitance is in proportion with the length of the line and in inverse proportion with the distance between the lines. Since the distance between the first current lines 13 is determined by the pixel pitch, the sum of the interline capacitance between two adjacent current lines 13 and the pixel signal line 12 is minimized when the pixel signal line 12 is situated at the center of the two adjacent current lines. When the panel size and the definition of the display are increased to necessitate high speed driving, an increase in the load capacitance lowers the writing speed and deteriorates the image quality. Accordingly, positioning the pixel signal line 12 at the center of the adjacent current lines 13 is optimal also to reduce the wiring load capacitance.

Embodiment 6

Figure 15:
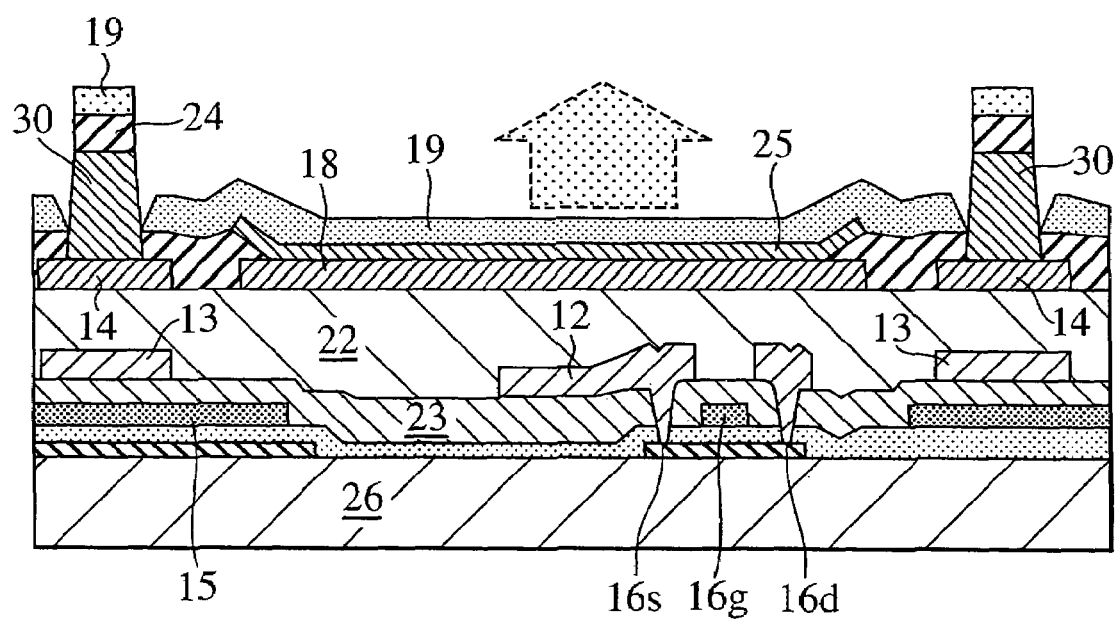
FIG. 15 is a cross-sectional view of a display device according to a sixth embodiment of the invention, which is a cross sectional view at a position coincident with the line XIV-XIV shown in FIG. 13.

FIG. 15 is a view of the construction of an active matrix type display device representing a sixth embodiment of the invention. This is a cross-sectional view showing a portion at a position corresponding with that for the line XIV-XIV of the fifth embodiment shown in FIG. 13. This embodiment is different from the fifth embodiment in that it adds a process of forming a partition wall 30 made of an insulator after forming the line 14 in the lower layer portion; and the partition wall 30 has a width equal with or less than the second line 14 and is higher than the layer thickness of the transparent pixel electrode 19.

After forming the partition wall 30, an interlayer insulative layer 24 that is provided with an aperture that defines a light emitting portion is formed, and an organic LED material is vapor deposited by using a mask for organic LED devices 25 of different emitting colors, while taking care, for example, that they cover the opening defined on every color and that the organic LED material is not deposited to the contact area 27. Alternatively, the organic LED device 25 may be formed also by dissolving a light emitting material in a solvent and carrying out printing using an ink jet printer or the like. Such a method of stacking the organic LED device 25 is merely presented as an example and is not meant to limit the invention. After stacking the organic LED device 25, as described above, a transparent conductive layer serving as a transparent pixel electrode 19 is further stacked over the entire surface. The stacked transparent conductive layer is connected on a row of pixels basis by the partition walls 30 formed on the second current lines 14 so as to separate the second current lines 14, respectively, through contact areas 27.

With the manufacturing method as described above, when organic LED devices emitting light of different colors, for example, red, green and blue, on a row of pixels basis are arranged successively, the bias for the organic LED devices can be controlled in accordance with the respective colors by connecting the second current lines 14 separately on a color basis to the power source at the periphery of the display region. Since the light emission characteristics, such as the current and the life, of the organic LED devices are different from each other on a color basis, determination of the optimal bias voltage on a color basis in view of the color display produced on a display device is important for displaying color images of high quality.

Embodiment 7

Figure 16:
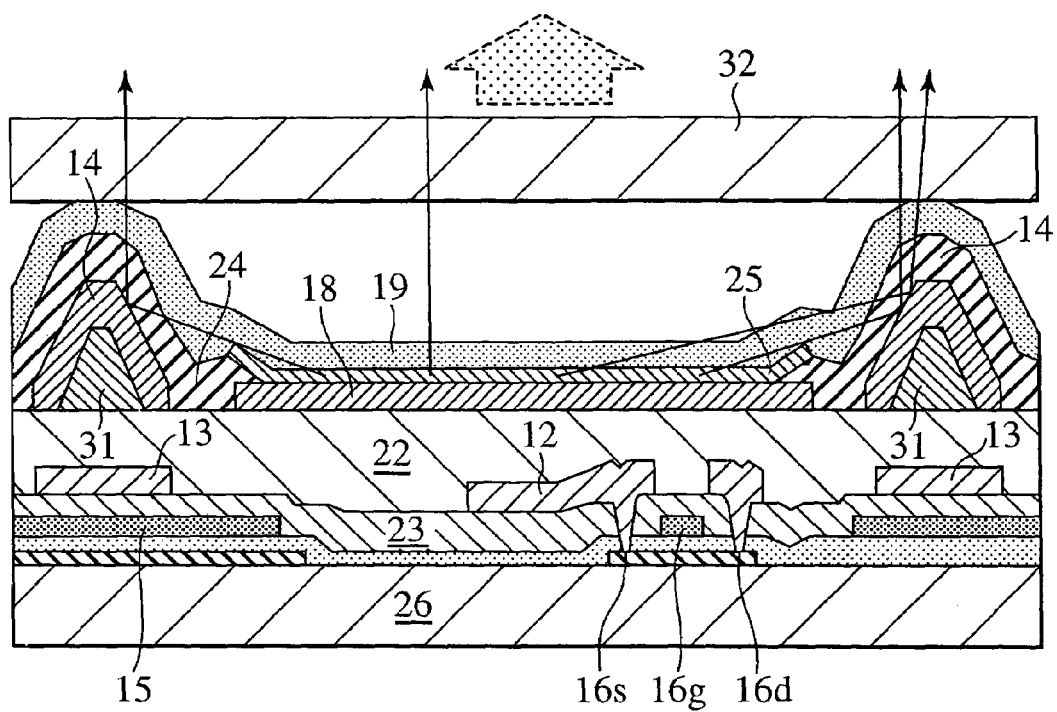
FIG. 16 is a cross-sectional view of a display device according to a seventh embodiment of the invention, which is a cross sectional view at a position coincident with the line XIV-XIV shown in FIG. 13.

FIG. 16 is a view of the construction of an active matrix type display device representing a seventh embodiment of the invention. This is a cross-sectional view showing a portion at a position identical with that taken along line XIV-XIV of the fifth embodiment shown in FIG. 13.

This embodiment is different from the second embodiment in view of the cross-sectional structure of the second current line 14. That is, as shown in the figure, the second current lines 14 are formed so as to cover the outer surface of protruded ridges 31 formed on the intermediate layer of the insulative layer 22. The protruded ridge 31 is formed with a width narrower than that of the second current line 14 and a height from ½ times to twice the thickness of the second current line. In short, the second current line 14 is formed so as to cover the outer surface of the protruded ridge 31, such that the height of the line 14 is higher than the height of the transparent pixel electrode 19 at a portion opposing the metal pixel electrode 18.

According to this constitution, it is possible to cope with the requirements of a colored display by employing the same effect as that of the partition wall 30 of the sixth embodiment, as well as to provide an effect of increasing the amount of light that can be taken out of the organic LED device 25 and suppress a mixing of emission light with that from other adjacent pixels.

Figure 17:
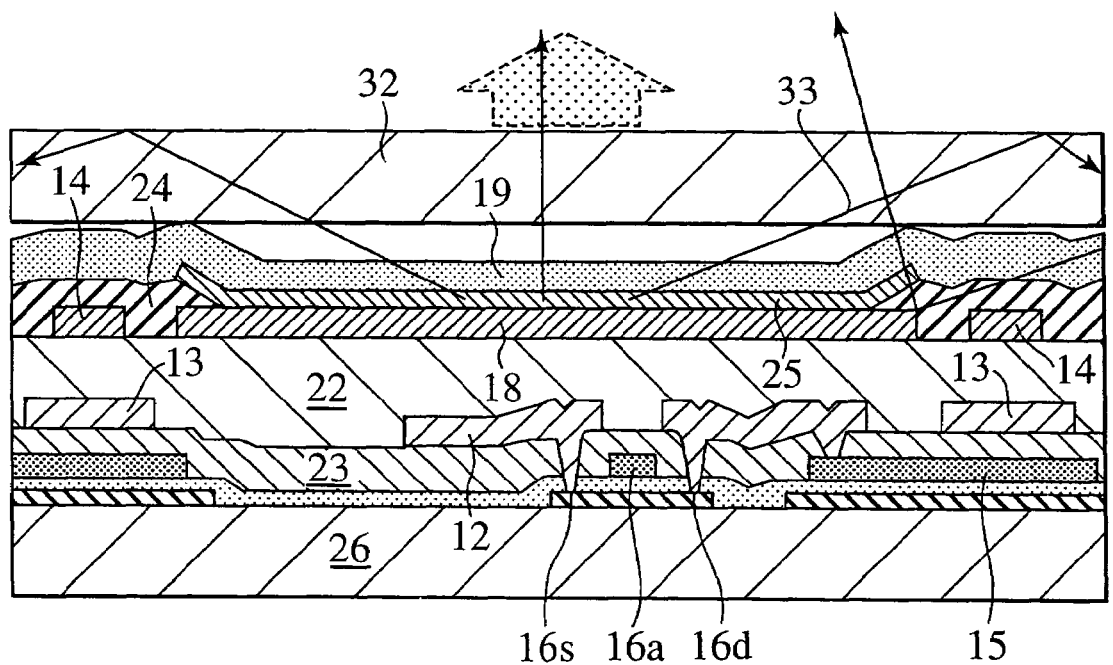
FIG. 17 is a cross-sectional view of a display device illustrating the effect of the display produced by the seventh embodiment.

That is, as shown in FIG. 17, in a case where the metal pixel electrode 18 and the flat second current lines 14 are formed on the flat insulative layer 22, having a surface unevenness of 100 nm or less, light emitted from the organic LED device 25 passes through a surface protective layer 32 to the outside as emission light. However, the light emitting in an oblique direction, as shown by an arrow 33 in the figure, is reflected at the boundary of the surface protective layer 32 and propagates in the lateral direction through the inside. As a result, this not only lowers the emission efficiency, but it also lowers the contrast, when the light is reflected at the electrode of another pixel and is emitted externally so as to cause degradation of the image quality.

In view of the above, to decrease the light propagating inside, as described above, the second current line 14 is constituted as shown in FIG. 16. That is, among the light beams emitted obliquely from the organic LED device 25, a light beam having a small incident angle relative to the surface protective layer 32 is reflected on the surface of the second current line 14, which has a convex cross-section, and is taken out to the outside as the emission light of the pixel. Accordingly, the light output efficiency can be improved as a whole.

When the display device in each of the embodiments according to this invention, as described above, is constituted as a top emission type, a display of high brightness and high image quality can be attained by realizing pixels of high aperture ratio and suppressing the factors of degradation in the image quality due to light emission or electric signals.

In the embodiments described above, while each of the thin film transistors 16, 17 is constituted as a top gate type, it will be apparent that an identical effect can also be obtained by constituting each of them as a bottom gate type.

Further, the thin film transistors 16, 17 are not restricted only to polycrystalline silicon, but may be formed also with amorphous silicon or single crystal silicon without changing the effects of the invention.

Further, the number of the thin film transistors in the pixel is not restricted only to two, but more than two thin film transistors can be used in accordance with the constitution of the driving circuit.

While descriptions have been provided of an example using ITO as the transparent electrode 19, other conductive layers of high light permeability, such as those made of IZO, may be used. Furthermore, the current lines 13, 14 are not restricted only to Al, but a metal such as copper Cu of lower resistance can be used.

As has been described above, this invention can provide a concrete pixel structure for producing a top emission type display using a light emission device.

Further, this invention can provide a current supply structure to a transparent pixel electrode that is capable of coping with the enlarging size of a top emission type display using a light emission device.

Further, this invention can provide a pixel structure that is suitable for coloration of a panel providing a top emission type display using organic LED devices.

While the invention has been described with reference to preferred embodiments, it is to be understood that the words which have been used are words of description rather than limitation, and that changes within the purview of the appended claims may be made without departing from the true scope and spirit of the invention in its broader aspects.

The invention claimed is:

1. An active matrix type display, comprising:
   a substrate;
   a plurality of pixel signal lines;
   a plurality of scanning signal lines; and
   a plurality of pixels arranged in a matrix form on the substrate;
   wherein each of the pixels includes a transparent pixel electrode, a metal pixel electrode, and a light emission device formed between the transparent pixel electrode and the metal pixel electrode;
   wherein first current lines are formed so as to extend in a direction perpendicular to an extension direction of the scanning signal lines;
   wherein second current lines are formed in a same layer as a layer of the metal pixel electrode and supply a drive electric current to the light emission device; and
   wherein the second current lines are formed so as to extend in a direction parallel with the extension direction of the scanning signal lines, and one of the second current lines is directly connected with the transparent pixel electrode.

2. An active matrix type display according to claim 1, wherein the second current lines are disposed so as to extend in the direction parallel with a shorter side of the metal pixel electrode.

3. An active matrix type display according to claim 1, wherein each of the pixels includes a transistor controlling driving current of the light emission device.

4. An active matrix type display according to claim 1, wherein a protective layer is formed above the transparent pixel electrode.

5. An active matrix type display according to claim 1, wherein the second current lines have a convex cross section.

* * * * *